(12) United States Patent
Huang et al.

(10) Patent No.: US 12,334,436 B2
(45) Date of Patent: Jun. 17, 2025

(54) METAL INTERCONNECT STRUCTURE HAVING SERPENT METAL LINE

(71) Applicant: UNITED MICROELECTRONICS CORP., Hsin-Chu (TW)

(72) Inventors: Shih-Che Huang, Chiayi (TW); Ching-Chih Chang, Tainan (TW); Yuan-Fu Ko, Tainan (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 194 days.

(21) Appl. No.: 17/472,577

(22) Filed: Sep. 10, 2021

(65) Prior Publication Data
US 2023/0050928 A1    Feb. 16, 2023

(30) Foreign Application Priority Data

Aug. 13, 2021 (CN) ............ 202110930120.1

(51) Int. Cl.
*H01L 23/528* (2006.01)
*H01L 23/522* (2006.01)

(52) U.S. Cl.
CPC ........ *H01L 23/528* (2013.01); *H01L 23/5226* (2013.01)

(58) Field of Classification Search
CPC .... H01L 23/528; H01L 23/5226; H01L 22/32
See application file for complete search history.

(56) References Cited

U.S. PATENT DOCUMENTS

| 7,013,446 | B2 | 3/2006 | Ohba et al. | |
| 8,421,186 | B2* | 4/2013 | Li | G11C 17/16 |
| | | | | 337/414 |
| 2009/0085182 | A1* | 4/2009 | Yamazaki | G06K 19/07794 |
| | | | | 257/679 |
| 2015/0206603 | A1* | 7/2015 | Choi | H01L 23/528 |
| | | | | 257/529 |
| 2016/0172428 | A1 | 6/2016 | Song et al. | |
| 2016/0218072 | A1* | 7/2016 | Liao | H01L 23/66 |
| 2021/0257296 | A1* | 8/2021 | Chan | H01L 21/76805 |

OTHER PUBLICATIONS

Deng, T., Zhang, Y.P., "On-Chip Antennas;" in Chen, Z., Liu, D., Nakano, H., Qing, X., Zwick, T. (eds) Handbook of Antenna Technologies; Springer, Singapore (Sep. 16, 2016). (Year: 2016).*

* cited by examiner

*Primary Examiner* — Benjamin P Sandvik
*Assistant Examiner* — John Patrick Cornely
(74) *Attorney, Agent, or Firm* — Winston Hsu

(57) ABSTRACT

A semiconductor device includes a first metal interconnection disposed on a substrate, a second metal interconnection disposed on the first metal interconnection, a first contact via disposed between the first metal interconnection and the second metal interconnection, a first serpent metal line connecting to a first end of the first metal interconnection, and a second serpent metal line connecting to a second end of the first metal interconnection. Preferably, the first serpent metal line, the second serpent metal line, and the first metal interconnection are on a same level.

13 Claims, 3 Drawing Sheets

METAL INTERCONNECT STRUCTURE HAVING SERPENT METAL LINE

BACKGROUND OF THE INVENTION

1. Field of the Invention

The invention relates to a semiconductor device, and more particularly, to a metal interconnect structure having serpent metal line.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance. The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the ULSI technology. For this reason, prior art attempts to reduce the RC delays have focused on utilizing material with a low-k to fill the gaps between the metal lines.

Typically, operations conducted under high voltage often accumulate electrical charges as a result of long metal lines and electrochemical or more specifically galvanic effect caused by etching processes also induces loss of copper ions at bottom of conductive plugs. Hence, how to effectively improve these issues has become an important task in this field.

SUMMARY OF THE INVENTION

According to an embodiment of the present invention, a semiconductor device includes a first metal interconnection disposed on a substrate, a second metal interconnection disposed on the first metal interconnection, a first contact via disposed between the first metal interconnection and the second metal interconnection, a first serpent metal line connecting to a first end of the first metal interconnection, and a second serpent metal line connecting to a second end of the first metal interconnection. Preferably, the first serpent metal line, the second serpent metal line, and the first metal interconnection are on a same level.

According to another aspect of the present invention, a semiconductor device a first metal interconnection on a substrate, a second metal interconnection on the first metal interconnection, a first contact via disposed between the first metal interconnection and the second metal interconnection, a first serpent metal line connecting to a first end of the second metal interconnection, and a second serpent metal line connected to a second end of the second metal interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
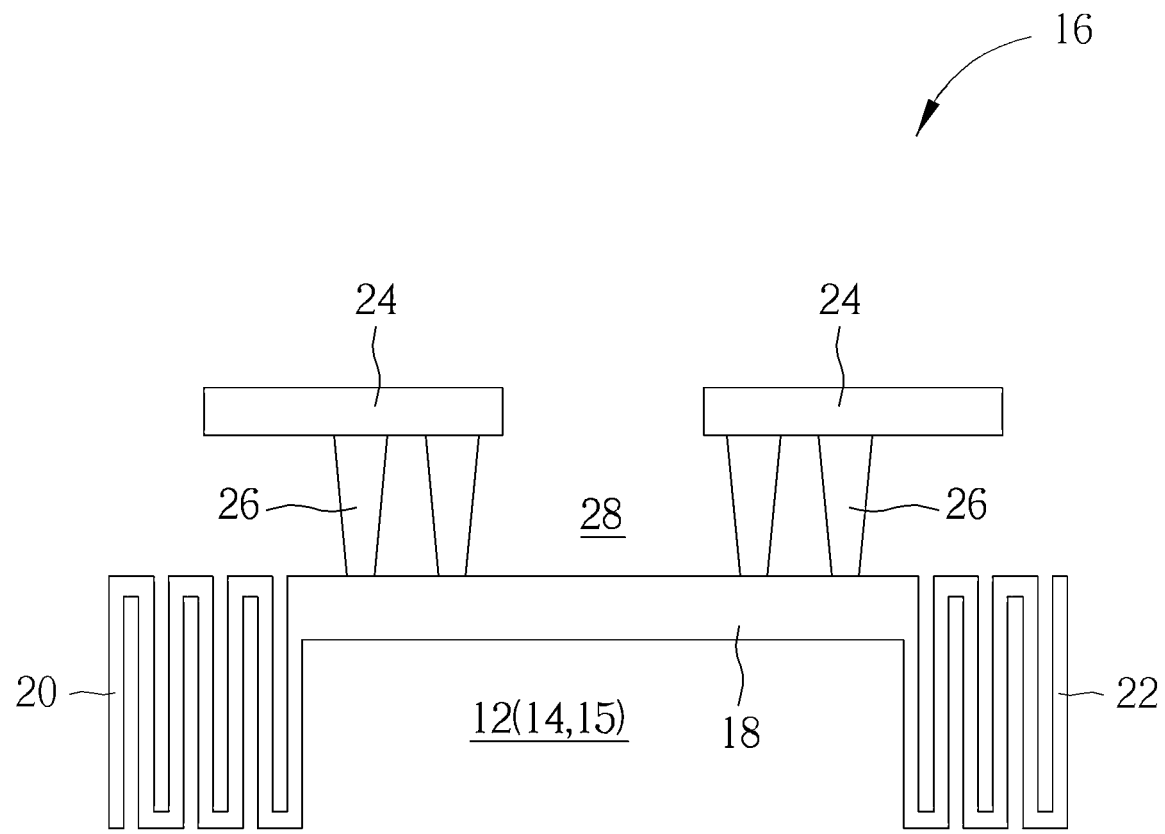
FIG. 1 illustrates a structural view of a semiconductor device according to an embodiment of the present invention.
Figure 2:
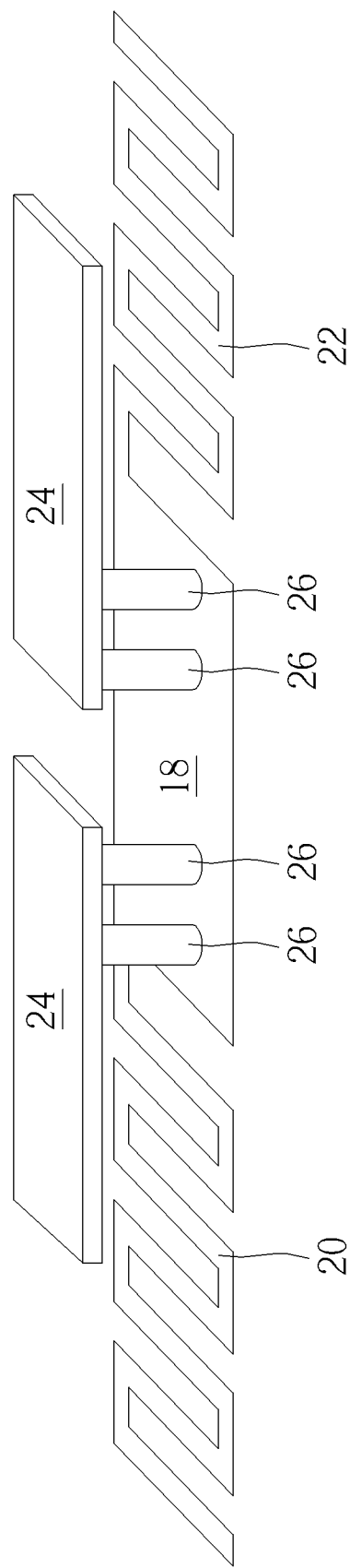
FIG. 2 illustrates a 3-dimensional view of the semiconductor device shown in FIG. 1.

Referring to FIGS. 1-2, FIG. 1 illustrates a structural view of a semiconductor device according to an embodiment of the present invention and FIG. 2 illustrates a 3-dimensional view of the semiconductor device shown in FIG. 1. As shown in FIGS. 1-2, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer 14 could also be formed on top of the substrate 12. More specifically, planar MOS transistors or non-planar (such as FinFETs) MOS transistors could be formed on the substrate 12, in which the MOS transistors could include transistor elements such as metal gates and source/drain region, spacers, epitaxial layers, and contact etch stop layer (CESL). As illustrated in FIG. 1, the ILD layer 14 could be formed on the substrate 12 to cover the MOS transistors 15 formed on the substrate 12, and a plurality of contact plugs could be formed in the ILD layer 14 to electrically connect to the gates and/or source/drain regions of MOS transistors 15. Since the fabrication of planar or non-planar transistors and ILD layer is well known to those skilled in the art, the details of which are not explained herein for the sake of brevity.

Next, at least a set of metal interconnect structure 16 is formed on the ILD layer 14 to electrically connect to the aforementioned contact plugs, in which the metal interconnect structure 16 includes a first level metal interconnection 18 disposed on the ILD layer 14, a serpent metal line 20 connected to or physically contacting a first end of the first level metal interconnection 18, a serpent metal line 22 connected to or physically contacting a second end of the first level metal interconnection 18, a second level metal interconnection 24 disposed on the first level metal interconnection 18, a plurality of contact vias 26 disposed between the first level metal interconnection 18 and second level metal interconnection 24, and inter-metal dielectric (IMD) layer 28 disposed around the first level metal interconnection 18, the serpent metal lines 20, 22, the second level metal interconnection 24, and the contact vias 26.

It should be noted that the first level metal interconnection 18, the contact vias 26, and the second level metal interconnection 24 disposed on the central region of FIG. 1 are preferably structures viewed from a cross-section perspective while the serpent metal lines 20 and 22 adjacent to two sides and connecting to two ends of the first level metal interconnection 18 are structures viewed from a top view perspective. Specifically, the so-called "serpent" metal lines disclosed in this embodiment refer to substantially twisting and winding manner of the metal lines resembling to a snake viewed under a top view perspective. Moreover, even though each of the serpent metal lines includes approximately six winding twists in this embodiment, according to other embodiment of the present invention, it would also be desirable to adjust the number of twists of the metal lines depending on the demand of the product. For instance, it would be desirable to form serpent metal lines with any number of twists such as two winding twists, three winding twists, seven winding twists, or even eight winding twists, which are all within the scope of the present invention.

Furthermore, even though two ends of the first level metal interconnection 18 are connected to the serpent metal lines 20, 22 at the same time in this embodiment, according to other embodiment of the present invention, it would also be desirable to only connect one end of the first level metal interconnection 18 to the serpent metal lines 20 or 22 while the other end of the first level metal interconnection 18 is not connected to any metal line, which is also within the scope of the present invention. Since the first level metal interconnection 18 and serpent metal lines 20, 22 are fabricated under a same process, the first level metal interconnection 18 and the serpent metal lines 20, 22 are preferably on the same level. For instance, both the first level metal interconnection 18 and the serpent meta lines 20, 22 are disposed on the surface of the ILD layer 14 underneath according to the cross-section view while the bottom surface of the first level metal interconnection 18 is preferably even with the bottom surface of the serpent metal lines 20, 22. Moreover, it should be noted that even though the top surface of the first level metal interconnection 18 is connected to the second level metal interconnection 24 through the contact vias 26 in this embodiment, the bottom surface of the first level metal interconnection 18 is not connected to any conductor but only contacting the ILD layer 14 directly.

It should be also noted that even though only two level of metal interconnections are disclosed in this embodiment, according to other embodiment of the present invention, it would also be desirable to form one or more metal interconnect structures on top of the second level metal interconnection 24, which is also within the scope of the present invention. Preferably, each of the first level metal interconnection 18 and second level metal interconnection 24 from the metal interconnect structure 16 include trench conductors while each of the contact vias 26 include via conductors and each of the first level metal interconnection 18, contact vias 26, and second level metal interconnection 24 could be connected to each other through single or dual damascene processes. Since the single or dual damascene processes are well known to those skilled in the art, the details of which are not explained herein for the sake of brevity. Moreover, the first level metal interconnection 18, the contact vias 26, and the second level metal interconnection 24 are preferably made of copper and the IMD layer 28 is made of silicon oxide, but not limited thereto.

Figure 3:
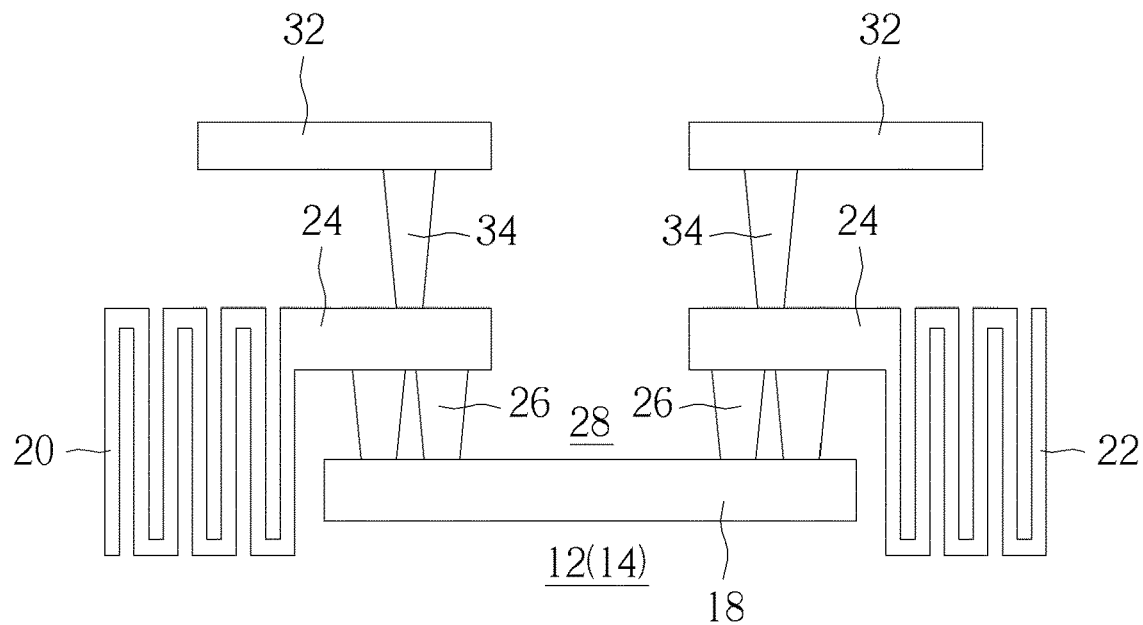
FIG. 3 illustrates a structural view of a semiconductor device according to an embodiment of the present invention.

Referring to FIG. 3, FIG. 3 illustrates a structural view of a semiconductor device according to an embodiment of the present invention. As shown in FIG. 3, the semiconductor device preferably includes a first level metal interconnection 18 disposed on the ILD layer 14, a second level metal interconnection 24 disposed on the first level metal interconnection 18, contact vias 26 disposed between the first level metal interconnection 18 and the second level metal interconnection 24, a third level metal interconnection 32 disposed on the second level metal interconnection 24, contact vias 34 disposed between the second level metal interconnection 24 and the third level metal interconnection 32, a serpent metal line 20 connected to one end of the second level metal interconnection 24, and another serpent metal line 22 connected to a second end of the second level metal interconnection 24.

In contrast to the serpent metal lines 20, 22 connecting to two ends of the first level metal interconnection 18 respectively in the previous embodiment, the serpent metal lines 20, 22 in this embodiment are connected to or physically contacting two ends of the second level metal interconnection 24 while the first level metal interconnection 18 and the third level metal interconnection 32 are not connected to any serpent metal line. Nevertheless, even though two ends of the second level metal interconnection 24 are connected to the serpent metal lines 20, 22 in this embodiment, according to other embodiment of the present invention, it would also be desirable to connect one end of the second level metal interconnection 24 to the serpent metal line 20 or 22 while the other end of the second level metal interconnection 24 is not connected to any other metal line, which is also within the scope of the present invention.

Similar to the aforementioned embodiment, since the second level metal interconnection 24 and the serpent metal lines 20, 22 are fabricated under a same process, the second level metal interconnection 24 and the serpent metal lines 20, 22 are preferably on the same level. For instance, both the second level metal interconnection 24 and the serpent meta lines 20, 22 are disposed on the surface of the IMD layer 28 underneath according to a cross-section view while the bottom surface of the second level metal interconnection 24 is preferably even with the bottom surface of the serpent metal lines 20, 22. Moreover, it should be noted that even though the top surface of the first level metal interconnection 18 is connected to the second level metal interconnection 24 through the contact vias 26 in this embodiment, the bottom surface of the first level metal interconnection 18 is not connected to any conductor but only contacting the ILD layer 14 directly.

Figure 4:
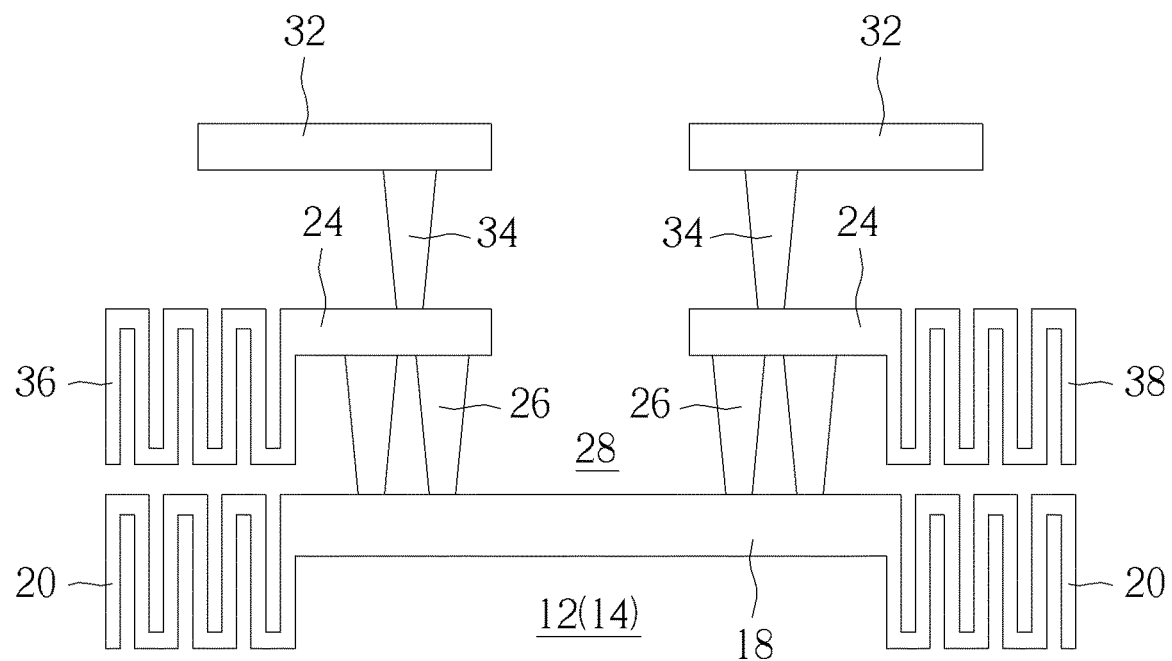
FIG. 4 illustrates a structural view of a semiconductor device according to an embodiment of the present invention.

Referring to FIG. 4, FIG. 4 illustrates a structural view of a semiconductor device according to an embodiment of the present invention. As shown in FIG. 4, the semiconductor device preferably includes a first level metal interconnection 18 disposed on the ILD layer 14, a second level metal interconnection 24 disposed on the first level metal interconnection 18, contact vias 26 disposed between the first level metal interconnection 18 and the second level metal interconnection 24, a third level metal interconnection 32 disposed on the second level metal interconnection 24, contact vias 34 disposed between the second level metal interconnection 24 and the third level metal interconnection 32, a serpent metal line 20 connected to a first end of the first level metal interconnection 18, a serpent metal line 22 connected to a second end of the first level metal interconnection 18, a serpent metal line 36 connected to a first end of the second level metal interconnection 24, and a serpent metal line 38 connected to a second end of the second level metal interconnection 24.

In contrast to the serpent metal lines 20, 22 are only connected to two ends of the first level metal interconnection 18 or the second level metal interconnection 24 in the previous embodiments, two sets of serpent lines are formed in the metal interconnect structure of this embodiment, in which one set of serpent metal lines 20, 22 are connected to or physically contacting two ends of the first level metal interconnection 18 while another set of serpent metal lines 36, 38 are connected to or physically contacting two ends of the second level metal interconnection 24.

Similarly, it would be noted that even though two ends of the first level metal interconnection 18 are connected to the serpent metal lines 20, 22 and two ends of the second level metal interconnection 24 are connected to the serpent metal lines 36, 38 in this embodiment, according to other embodiment of the present invention, it would also be desirable to connect one end of the first level metal interconnection 18 to the serpent metal line 20 or 22 while the other end of the first level metal interconnection 18 is not connected to any other metal line, and also connect one end of the second level metal interconnection 24 to the serpent metal line 36 or 38 while the other end of the second level metal interconnection 24 is not connected to any other metal line, which is also within the scope of the present invention.

Similar to the aforementioned embodiment, since the first level metal interconnection 18 and the serpent metal lines 20, 22 are fabricated under same process, the first level metal interconnection 18 and the serpent metal lines 20, 22 are preferably on the same level. Also, since the second level metal interconnection 24 and the serpent metal lines 36, 38 are fabricated under same process, the second level metal interconnection 24 and the serpent metal lines 36, 38 are on the same level. For instance, both the first level metal interconnection 18 and the serpent meta lines 20, 22 are disposed on the surface of the ILD layer 14 underneath according to a cross-section view while the bottom surface of the first level metal interconnection 18 is even with the bottom surface of the serpent metal lines 20, 22, and both the second level metal interconnection 24 and the serpent meta lines 36, 38 are disposed on the surface of the IMD layer 28 underneath according to a cross-section view while the bottom surface of the second level metal interconnection 24 is preferably even with the bottom surface of the serpent metal lines 36, 38. Moreover, even though the top surface of the first level metal interconnection 18 is connected to the second level metal interconnection 24 through the contact vias 26 in this embodiment, the bottom surface of the first level metal interconnection 18 is not connected to any conductor but only contacting the ILD layer 14 directly.

Typically, operations conducted under high voltage often accumulate electrical charges as a result of long metal lines and electrochemical or more specifically galvanic effect caused by etching processes also induces loss of copper ions at bottom of conductive plugs. To resolve these issues the present invention preferably incorporates serpent metal lines into metal interconnect structures formed during back-end-of-line (BEOL) process according to the aforementioned three embodiments to form a new testkey structure so that loss of copper ions caused by galvanic effect could be inspected. According to a preferred embodiment of the present invention, the integrated structure formed by combining the serpent metal lines and BEOL metal interconnections could prevent easily breakage of conventional serpent metal lines caused during patterning process and inspection or examination of copper loss in metal lines could be reinforced substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a metal interconnect structure formed on a substrate and electrically connected to a MOS transistor formed on the substrate, wherein the substrate is made of a semiconductor material, and the metal interconnect structure comprises:
        a first metal interconnection on the substrate;
        a second metal interconnection on a face of the first metal interconnection opposite to the substrate; and
        a first contact via disposed between the first metal interconnection and the second metal interconnection;
        a first serpent metal line connecting to a first end of the first metal interconnection, wherein the first serpent metal line comprises more than two twists and the more than two twists comprise same width, the more than two twists comprise a first U-shape twist, a second U-shape twist, and a third U-shape twist, each of the first U-shape twist, the second U-shape twist, and the third U-shape twist comprises a first vertical portion, a second vertical portion, and a horizontal portion connecting the first vertical portion and the second vertical portion, and the first vertical portion, the second vertical portion, and the horizontal portion of the first U-shape twist, the second U-shape twist, the third U-shape twist comprise same width, bottom surfaces of the first serpent metal line and the first metal interconnection are coplanar, and a third end of the first serpent metal line is connected to the first end of the first metal interconnection and a fourth end of the first serpent metal line is not connected to any conductor; and
        a second serpent metal line connecting to a second end of the first metal interconnection, wherein a fifth end of the second serpent metal line is connected to the second end of the first metal interconnection and a sixth end of the second serpent metal line is not connected to any conductor.

2. The semiconductor device of claim 1, wherein the first serpent metal line and the first metal interconnection are on a same level.

3. The semiconductor device of claim 1, wherein the second serpent metal line and the first metal interconnection are on a same level.

4. The semiconductor device of claim 1, wherein a bottom surface of the first metal interconnection is not connected to any conductor.

5. The semiconductor device of claim 1, wherein a top surface of the first metal interconnection is connected to the first contact via.

6. The semiconductor device of claim 1, further comprising a third serpent metal line connected to a first end of the second metal interconnection.

7. The semiconductor device of claim 1, further comprising a fourth serpent metal line connected to a second end of the second metal interconnection.

8. The semiconductor device of claim 1, further comprising:
    a third metal interconnection on the second metal interconnection; and
    a second contact via disposed between the second metal interconnection and the third metal interconnection.

9. A semiconductor device, comprising:
    a first metal interconnection formed on a substrate, where a MOS transistor is formed;
    a second metal interconnection formed on a face of the first metal interconnection opposite to the substrate, wherein the second metal interconnection comprises a first portion connected to a first end of the first metal interconnection and a second portion connected to a second end of the first metal interconnection;
    a first contact via disposed between and directly contacting the first metal interconnection and the second metal interconnection, wherein a bottom surface of the first metal interconnection directly under the first contact via is not connected to any conductor;
    a first serpent metal line connecting to the first portion of the second metal interconnection, wherein the first serpent metal line comprises more than two twists and a third end of the first serpent metal line is connected to the first portion of the second metal interconnection and a fourth end of the first serpent metal line is not connected to any conductor;

a second serpent metal line connecting to the second portion of the second metal interconnection, wherein a fifth end of the second serpent metal line is connected to the second portion of the second metal interconnection and a sixth end of the second serpent metal line is not connected to any conductor; and a third metal interconnection on a face of the second metal interconnection opposite to the first metal interconnection.

10. The semiconductor device of claim 9, wherein the first serpent metal line and the second metal interconnection are on a same level.

11. The semiconductor device of claim 9, wherein the second serpent metal line and the second metal interconnection are on a same level.

12. The semiconductor device of claim 9, wherein a top surface of the first metal interconnection is connected to the first contact via.

13. The semiconductor device of claim 9, further comprising:

a second contact via disposed between the second metal interconnection and the third metal interconnection.

* * * * *